United States Patent
Odabaee et al.

(12) United States Patent (10) Patent No.: US 11,270,986 B2
(45) Date of Patent: Mar. 8, 2022

(54) PACKAGE WITH OVERHANG INDUCTOR

(71) Applicant: Analog Devices, Inc., Norwood, MA (US)

(72) Inventors: Ahmadreza Odabaee, Milpitas, CA (US); John David Brazzle, Tracy, CA (US); Zafer Kutlu, Menlo Park, CA (US); Zhengyang Liu, Pleasanton, CA (US); George Anthony Serpa, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/998,666

(22) Filed: Aug. 20, 2020

(65) Prior Publication Data
US 2021/0358895 A1 Nov. 18, 2021

Related U.S. Application Data (60) Provisional application No. 63/026,386, filed on May 18, 2020.

(51) Int. Cl.
*H01L 25/16* (2006.01)
*H01F 27/28* (2006.01)
(Continued)

(52) U.S. Cl.
CPC ......... *H01L 25/16* (2013.01); *H01F 27/2804* (2013.01); *H01L 24/16* (2013.01);
(Continued)

(58) Field of Classification Search
None
See application file for complete search history.

(56) References Cited

U.S. PATENT DOCUMENTS

| 6,885,278 B2 * | 4/2005 | Nakao | H01F 19/08 336/200 |
| 9,000,576 B2 * | 4/2015 | Lee | H01L 23/49537 257/686 |

(Continued)

FOREIGN PATENT DOCUMENTS

TW I581384 B 5/2017

OTHER PUBLICATIONS

"Latest Pin-Compatible uModule Regulators with BGA package use inductor as heat sink", ELE Times, [Online] Retrieved from the Internet: <URL: https://www.eletimes.com/latest-pin-compatible-%CE%BCmodule-regulators-with-bga-package-use-inductor-as-heat-sink?approved=false>, (Mar. 16, 2019), 2 pgs.

(Continued)

*Primary Examiner* — Thomas J. Hiltunen
(74) *Attorney, Agent, or Firm* — Schwegman Lundberg & Woessner, P.A.

(57) ABSTRACT

This disclosure describes techniques to provide a regulator circuit using a component-on-top (CoP) package. The CoP package comprising a system-in-package (SIP) comprising regulator circuitry, the SIP having a top portion and a first side portion; and an inductor on the top portion of the SIP, wherein: the inductor is coupled to the regulator circuitry via the top portion of the SIP; and a first end of the inductor extends beyond the first side portion of the SIP.

22 Claims, 6 Drawing Sheets

(51) Int. Cl.
*H02M 3/04* (2006.01)
*H01L 23/00* (2006.01)

(52) U.S. Cl.
CPC ..... *H02M 3/04* (2013.01); *H01L 2224/16265* (2013.01); *H01L 2924/1427* (2013.01); *H01L 2924/19042* (2013.01)

(56) References Cited

U.S. PATENT DOCUMENTS

| | | | |
|---|---|---|---|
| 9,111,954 B2 * | 8/2015 | Chen | H02M 3/155 |
| 9,271,398 B2 * | 2/2016 | Chen | H01L 25/16 |
| 9,281,739 B2 * | 3/2016 | Ikriannikov | H01F 17/0033 |
| 9,607,917 B2 * | 3/2017 | Moussaoui | H01L 23/49555 |
| 9,693,461 B2 | 6/2017 | Zhao et al. | |
| 10,063,139 B2 | 8/2018 | Le et al. | |
| 10,111,333 B2 * | 10/2018 | Yin | H01L 25/16 |
| 10,135,335 B2 * | 11/2018 | Cho | H02M 3/158 |
| 10,199,361 B2 * | 2/2019 | Huang | H05K 3/3421 |
| 2002/0041216 A1 | 4/2002 | Welland et al. | |
| 2012/0159118 A1 | 6/2012 | Wong et al. | |
| 2015/0076700 A1 | 3/2015 | Yap | |
| 2015/0357112 A1 | 12/2015 | De Rochemont | |
| 2016/0133614 A1 | 5/2016 | Gu et al. | |
| 2017/0098997 A1 | 4/2017 | Hamada et al. | |
| 2019/0279973 A1 | 9/2019 | Min et al. | |
| 2019/0304865 A1 | 10/2019 | Brazzle et al. | |
| 2019/0326203 A1 | 10/2019 | Khoo et al. | |
| 2020/0052583 A1 | 2/2020 | Shekhar et al. | |

OTHER PUBLICATIONS

"uModule Power Products", Analog Devices Data Sheet, 32 pgs.
Xu, Kan, et al., "Power Noise and Near-Field EMI of High-Current System-in-Package With VR Top and Bottom Placements", IEEE Transactions on Components, Packaging and Manufacturing Technology, 9(4), (Apr. 2019), 712-718.

* cited by examiner

PACKAGE WITH OVERHANG INDUCTOR

CROSS-REFERENCE TO RELATED APPLICATION

This application claims the benefit of priority under 35 USC 119(e) of U.S. Provisional Patent Application No. 63/026,386, filed May 18, 2020, the contents of which are incorporated herein by reference in their entirety.

FIELD OF THE DISCLOSURE

This document pertains generally, but not by way of limitation, to a component-on-top (CoP) package regulator device.

BACKGROUND

Typical systems provide regulators, such as DC/DC regulators, using discrete physical components coupled together on a printed circuit board. Variations amongst these discrete components are typically accounted for using various passive components, which introduce noise and inefficiencies, and consume board space. As a result, combining all of these discrete components on a printed circuit board to provide voltage regulators limits the system versatility and performance reliability, increases manufacturing complexity and costs, and consumes a large amount of physical board space.

SUMMARY OF THE DISCLOSURE

This disclosure describes techniques to provide a regulator circuit using a CoP package. The CoP package comprising a system-in-package (SIP) comprising regulator circuitry, the SIP having a top portion and a first side portion; and an inductor on the top portion of the SIP, wherein: the inductor is coupled to the regulator circuitry via the top portion of the SIP; and a first end of the inductor extends beyond the first side portion of the SIP.

In some implementations, the inductor and the regulator circuitry of the SIP together implement a switching regulator.

In some implementations, the regulator circuitry includes a switching circuit for charging and discharging the inductor.

In some implementations, the inductor delivers a charge to a load coupled to the CoP package.

In some implementations, a second end of the inductor extends beyond a second side portion of the SIP. In some implementations, the second end of the inductor is parallel to or perpendicular to the first end of the inductor. In some implementations, the second end of the inductor is parallel to the second side portion of the SIP.

In some implementations, the SIP has four sides, and wherein respective ends of the inductor extend beyond each of the four side of the SIP.

In some implementations, the inductor includes first and second terminals, wherein the first and second terminals extend vertically down from a bottom portion of the inductor through the top portion of the SIP to the regulator circuitry. In some implementations, the first terminal is at a first position on the bottom portion of the inductor, the first position being at a specified distance from the first end of the inductor, and the first position overlaps the top portion of the SIP.

In some implementations, the SIP is coupled to a printed circuit board, wherein a passive or active component external to the SIP is coupled to the SIP via the circuit board, at least a portion of the passive or active component being physically placed within a region between the first end of the inductor and the first side of the SIP. In some implementations, the passive or active component comprises another SIP, a resistor, a capacitor, integrated-passive device, a transistor or an inductor.

In some implementations, the SIP is coupled to a printed circuit board, wherein a plurality of passive or active components external to the SIP is coupled to the SIP via the circuit board, at least a portion of the plurality of passive or active components being physically placed around a periphery of the SIP within a region between ends of the inductor and sides of the periphery of the SIP.

In some implementations, an empty space region is formed between a bottom of the inductor and the top portion of the SIP.

In some embodiments, the disclosure performs operations comprising: generating a regulated voltage signal by a regulator circuitry implemented on a system-in-package (SIP), the SIP having a top portion and a first side portion, the SIP coupled to an inductor via the top portion of the SIP, and a first end of the inductor extending beyond the first side portion of the SIP; and delivering the regulated voltage to a load.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A system-in-package (SIP) or system-in-a-package is a physical component manufactured with a number of integrated circuits enclosed in a single module (package). Dies containing integrated circuits may be stacked vertically on a substrate. They are internally connected by fine wires that are bonded to the package. Alternatively, with a flip-chip technology, solder bumps are used to join stacked chips together. SIP dies can be stacked vertically or tiled horizontally, unlike slightly less dense multi-chip modules, which place dies horizontally on a carrier. This means that a complete functional unit can be built in a multi-chip package, so that fewer external components are used to make the functional unit work.

A CoP package (or package-on-package PoP) is an integrated circuit packaging method to combine vertically discrete logic and memory ball grid array (BGA) packages, such as two or more SIP packages. Two or more packages are installed atop each other, e.g., stacked, with a standard interface to route signals between them. This allows higher component density in devices, such as mobile phones, personal digital assistants (PDA), and digital cameras, at the cost of slightly higher height requirements.

The size of the footprint on a printed circuit board (PCB) and the power output of a regulator (e.g., a DC/DC switching regulator) are usually considered in manufacturing regulators. A larger size regular may have a higher power output but may occupy a larger area on the PCB. Certain systems employ CoP packages to construct some components of the regulator into one package that is stacked on another package. The physical size of the PCB in these systems is dictated by the package on the top as the package on the bottom is designed to have the same size or be larger than the package on the top. As an example, in these systems, the amount of PCB space is determined by the size of the inductor top or on the bottom).

Some typical systems rely on higher switching frequency for the DC/DC regulator to reduce the physical footprint of the regulator on the PCB. However, such methods often result in lower operating efficiency, higher power loss and rise in junction temperature. Namely, efficiency and thermal performance are sacrificed to achieve smaller PCB footprint by the regulator.

This disclosure describes, among other things, techniques to provide a regulator, such as a DC/DC regulator, using a CoP package in which the inductor physically overhangs over top of the regulator package on the bottom. In particular, the disclosure provides a CoP package that includes a SIP package with regulator circuitry and an inductor. The SIP has a top portion and a first side portion and an inductor on the top portion of the SIP is coupled to the regulator circuitry via the top portion of the SIP. The inductor has a first end that extends beyond the first side portion of the SIP. In this way, the physical footprint occupied by the regulator circuitry on the bottom of the CoP package is not restricted by the size of the inductor on the top of the package. This allows a smaller footprint to be occupied by the regulator on the PCB and increases the efficiency and thermal performance of the regulator relative to systems that increase the switching frequency of the regulator to occupy a similar size footprint.

Figure 1:
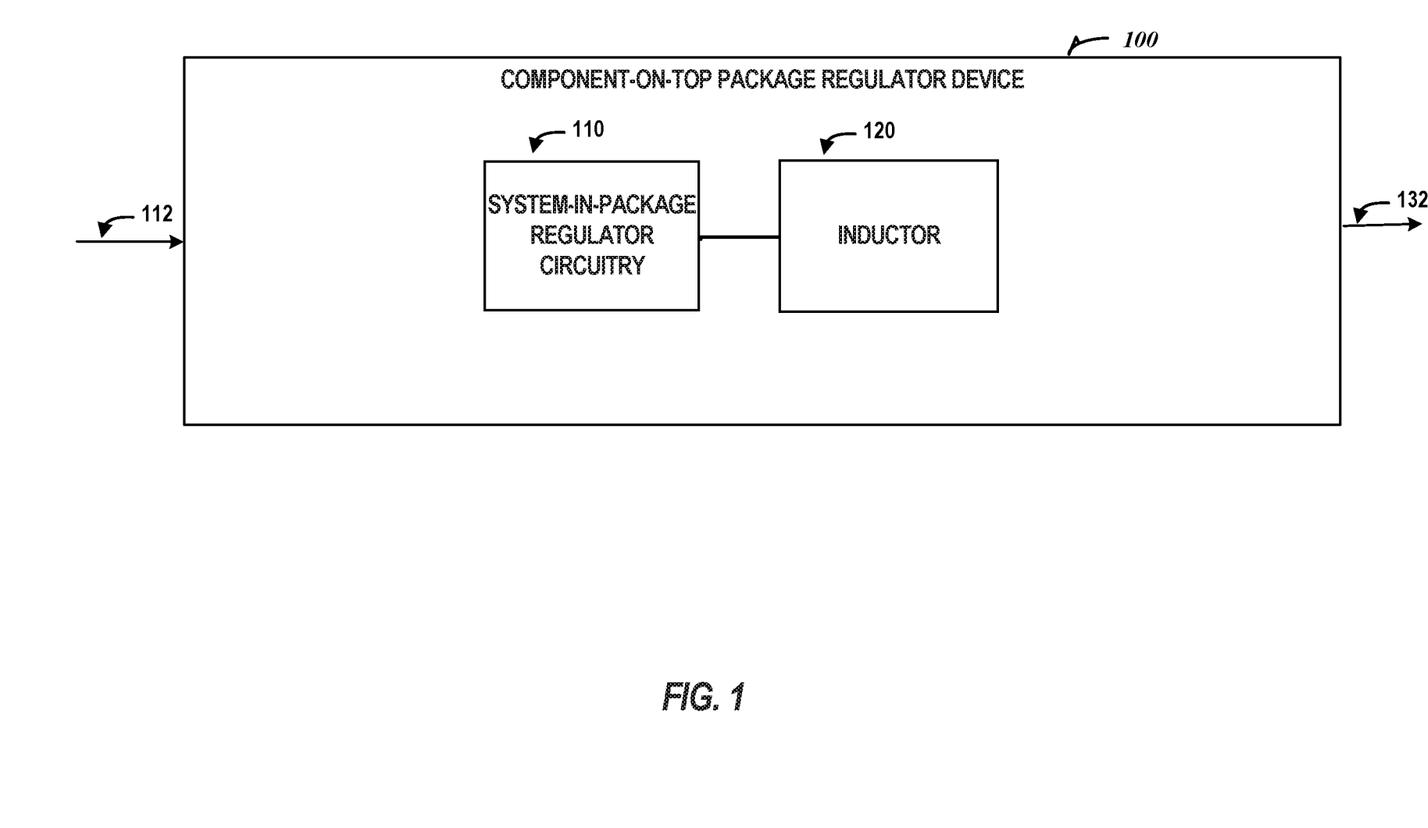
FIG. 1 is a block diagram of an example of a CoP package regulator device in accordance with various embodiments.

FIG. 1 is a block diagram of an example of a component-on-top package regulator device 100 in accordance with various embodiments. The component-on-top package regulator device 100 includes SIP regulator circuitry 110 and an inductor 120. While a SIP regulator circuitry 110 is shown as being implemented in the component-on-top package regulator device 100, any other type of amplifier, digital to analog converter, radio-frequency transmitter/receiver, or other device can be used in place of or in addition to the SIP regulator circuitry 110.

The component-on-top package regulator device 100 also includes an integrated-passive components network (e.g., an integrated-passive resistor and capacitor network) (not shown) coupled within the component-on-top package regulator device 100 and/or external to the component-on-top package regulator device 100. One or more external passive or active components, such as capacitors, inductors, resistors, transistors, and so forth are coupled to the component-on-top package regulator device 100 to adjust parameters of the SIP regulator circuitry 110.

The component-on-top package regulator device 100 receives an analog signal 112, which may be a differential signal or a single input signal. The analog signal 112 may be an AC or DC signal. Although only one differential or single analog signal 112 is shown in FIG. 1, any number of additional differential or single input signals may be received and processed in parallel by the component-on-top package regulator device 100. The component-on-top package regulator device 100 processes the analog signal 112 to generate an output signal 132, such as a regulated DC voltage that is stepped up or stepped down relative to the analog signal 112.

Each component of the SIP regulator circuitry 110 may be implemented and manufactured together on the same system-in-package and interconnected with one or more wires bonded to the SIP. The system-in-package may be a land grid array (LGA), a ball grid array (BGA), or a pin grid array (PGA) package. The inductor 120 may be manufactured together with the SIP regulator circuitry 110 or separate from the SIP regulator circuitry 110. The inductor 120 is physically connected to the SIP regulator circuitry 110 from a top portion of the SIP regulator circuitry 110 to form the component-on-top package regulator device 100.

In some implementations, a first portion of the components implemented on the SIP regulator circuitry 110 and/or the component-on-top package regulator device 100 may be fabricated using a first fabrication process (e.g., low-voltage MOS, high-voltage MOS, low-voltage DMOS, high-voltage DMOS, low-voltage bipolar, high-voltage bipolar, high-speed bipolar, BiCMOS, JFET, silicon germanium, silicon carbide, gallium nitride, gallium arsenide, gallium nitride on silicon carbide, gallium nitride on silicon, or silicon on insulator). A second portion of the components implemented on the SIP regulator circuitry 110 and/or the component-on-top package regulator device 100 may be fabricated using a second fabrication process (e.g., low-voltage MOS, high-voltage MOS, low-voltage DMOS, high-voltage DMOS, low-voltage bipolar, high-voltage bipolar, high-speed bipolar, BiCMOS, JFET, silicon germanium, silicon carbide, gallium nitride, gallium arsenide, gallium nitride on silicon carbide, gallium nitride on silicon, or silicon on insulator) different from the first fabrication process. For example, the SIP regulator circuitry 110 may be implemented with low-voltage JFET devices and the inductor 120 may be implemented by a discrete passive or active physical component.

The components in the SIP regulator circuitry 110 and/or the component-on-top package regulator device 100 may be coupled together through the series of integrated-passive devices (resistors and capacitors) via one or more wires that are bonded to or within the SIP. These integrated-passive devices may be fabricated using standard wafer fabrication techniques, such as thin-film and photolithography processing. The substrates for integrated-passive devices may be thin-film substrates such as silicon, alumina, or glass. For example, the integrated-passive resistors may be manufactured from high-accuracy thin-film silicon chromium (SiCr). The integrated-passive capacitors may be manufactured as metal-insulator-metal (MIM) capacitors.

Using such integrated-passive devices (components) (iPassive devices) provides a technological improvement over traditional systems that use discrete passive components. In particular, implementing integrated-passive devices in the SIP regulator circuitry 110 and/or the component-on-top package regulator device 100 enables superior performance to that obtained with discrete passive components, and the part-to-part variations in integrated-passive devices are lower than those in discrete passive components that are typically used on a printed circuit board to implement a traditional regulator.

Figure 2:
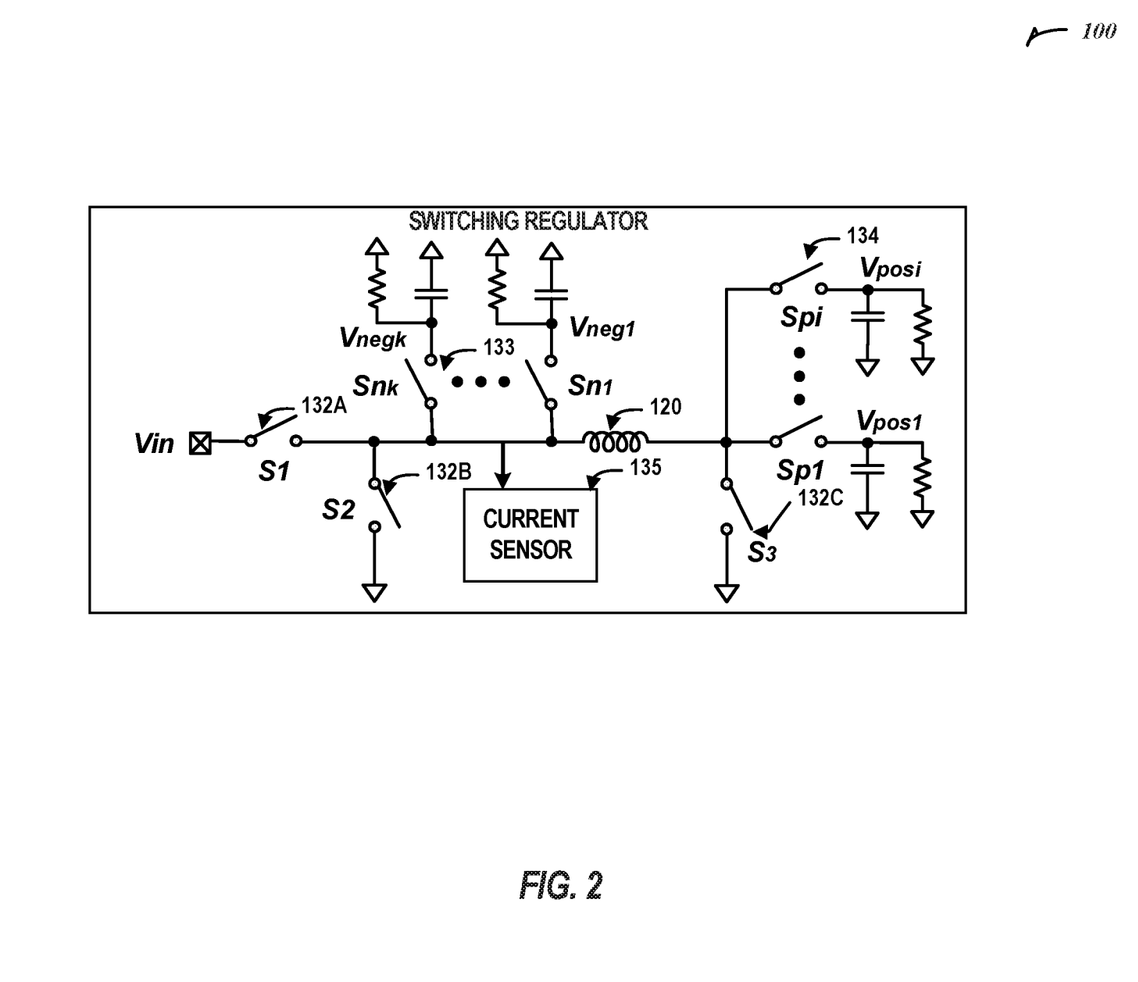
FIG. 2 is a block diagram of an example of a switching regulator implemented by the CoP package in accordance with various embodiments.

FIG. 2 is a block diagram of an example of a switching regulator implemented by the component-on-top package regulator device 100 in accordance with various embodiments. As an example, the component-on-top package regulator device 100 implements a single-input-multiple-output (SIMO) switching regulator.

The component-on-top package regulator device 100 may be a current-mode (CM) DC/DC switching power supply, also known as a current-mode DC/DC converter. Many other converter configurations can also benefit from the present disclosure. The type of converter shown in FIG. 2 is a peak current-mode converter. An overview of the functionality of the switching regulator shown in FIG. 2 is provided below, and further details are provided in U.S. Pat. No. 5,617,015, filed Jun. 7, 1995, which is hereby incorporated by reference in its entirety.

During operation, control circuitry (not shown) included in the component-on-top package regulator device 100 (e.g., as part of the SIP regulator circuitry 110) turns ON and OFF common loop switches 132A-C (S1, S2, and S3, respectively) of the switching regulator based on common loop signals at a particular frequency to control current flowing to negative channels 133 (Vnegk . . . Vneg1) and positive channels 134 (Vposi . . . Vpos1). The control circuitry also turns ON and OFF differential loop switches (Snk . . . Sn1 and Spi . . . Sp1) based on differential loop signals to control current flowing to individual positive and negative channels.

In one example, when the control circuitry turns ON the common loop switches 132A and 132C, an input voltage Vin (e.g., analog signal 112) is applied to an inductor 120 through the common loop switch 132A (S1) and causes a ramping current to flow through the inductor 120 in one phase. This current flows through a current sensor 135 (e.g., current-sense circuitry). In another phase, the current from the inductor 120 (which may not be the same ramping current as in the previous phase) flows through each of the negative channels 133 coupled to one terminal of the inductor 120 and through each of the positive channels 134 coupled to another terminal of the inductor 120. The control circuitry controls which individual ones of the positive and negative channels receive the current that flows through the inductor 120 by turning ON and OFF respective ones of the differential loop switches (Snk . . . Sn1 and Spi . . . Sp1).

The inductor 120 may be implemented by a top component of the component-on-top package regulator device 100 and the remaining circuit components shown in FIG. 2 may be implemented by a bottom component of the component-on-top package regulator device 100. In some cases, the inductor 120 and a first set of other elements shown in FIG. 2 may be implemented by the top component of the component-on-top package regulator device 100 and the remaining second set of elements may be implemented by the bottom component of the component-on-top package regulator device 100. In some cases, the inductor 120 may be implemented by a top component of the component-on-top package regulator device 100, a first set of the remaining circuit components shown in FIG. 2 may be implemented by a bottom component of the component-on-top package regulator device 100, and a second set of the remaining circuit components shown in FIG. 2 may be implemented off-chip and external to the component of the component-on-top package regulator device 100.

In some cases, the second set of remaining circuit components may be at least partially or completely covered by one or more sides of the inductor 120. For example, a side of the inductor 120 on a second or top level of the component of the component-on-top package regulator device 100 overhangs and extends beyond a side of the bottom component on a first or bottom level of the component-on-top package regulator device 100. This physical arrangement creates physical empty space between the side of the bottom component and the side of the inductor 120. One or more passive or active circuit elements (e.g., resistors, capacitors, transistors, integrated-passive components, inductors, and so forth) may be placed at least partially within the physical empty space on the same layer or level as the bottom component of the component of the component-on-top package regulator device 100.

The control circuitry receives the voltage outputs of each of the positive and negative channels. Based on a comparison of the voltages with a reference voltage, the control circuitry determines when to turn ON or OFF the common loop switches 132A-C. In an embodiment, the control circuitry computes a sum of all the positive channel voltages (Vposi . . . Vpos1) and also computes a sum of all the negative channel voltages (Vnegk . . . Vneg1). The control circuitry computes a difference between the sums of the positive and negative voltages and applies this voltage difference to the negative input of a transconductance error amplifier (not shown). A reference voltage Vref is applied to the positive input of the transconductance error amplifier. The output current of the transconductance error amplifier corresponds to the difference between the average actual output voltage across all the channels and the desired output voltage. A voltage across a capacitor at the output of the transconductance error amplifier is adjusted up or down based on the positive or negative current output of the transconductance error amplifier. Such a voltage is referred to as a control voltage Vcomp.

The control voltage Vcomp is applied to a pulse-width-modulation (PWM) comparator (also known as a current comparator, not shown). The ramping voltage across the current-sense circuitry, when the common loop switch 132A is ON, is sensed by a differential amplifier, in the current sensor 135, having a certain gain, and, when the output of the amplifier in the current sensor 135 exceeds the control voltage Vcomp, the PWM comparator is triggered to output a signal in the control circuitry. The control circuitry logically combines this signal with a clock signal received by the control circuitry to turn the common loop switch 132A ON or OFF and to control companion switches 132B and 132C. In an embodiment, the control companion switches 132B and 132C are companion switches to the common loop switch 132A and turn ON or OFF at the same time when the switch 132A is turned ON or OFF. In an embodiment, when the common loop switch 132A is turned ON, the control companion switches 132B and/or 132C are turned OFF. For example, when the common loop switch 132A turns OFF, the control companion switch 132B turns ON to discharge the inductor 120, causing a downward ramping current. In this way, the peak current through the inductor 120 for each cycle is regulated to provide the required average current to maintain a regulated output voltage at each positive and negative channel. An example of when certain ones of the common loop switches 132A-C and differential loop switches are turned ON and OFF based on an output of the PWM comparator associated with each loop is provided in U.S. Pat. No. 9,479,052, filed Mar. 13, 2015, which is hereby incorporated by reference in its entirety.

Figure 3:
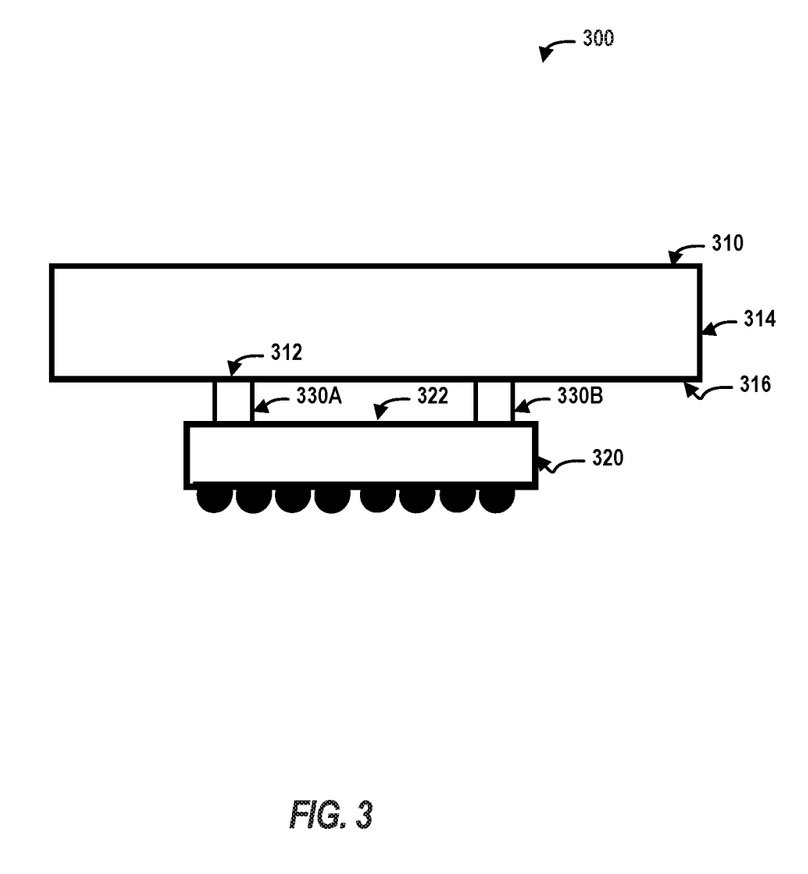
FIG. 3 is a block diagram of an example physical layout of the CoP package regulator device in accordance with various embodiments.

FIG. 3 is a block diagram of an example physical layout 300 of the COP package regulator device (e.g., the component-on-top package regulator device 100 (FIG. 1) in accordance with various embodiments. As shown in physical layout 300, an inductor 310 (corresponding to inductor 120) is physically placed on top of another component 320 (corresponding to SIP regulator circuitry 110). The component 320 may be referred to as a bottom component or first layer/level component that is placed on top of a PCB and the inductor 310 may be referred to as the top component or second layer/level component that is placed on top of the first layer/level component 320.

The inductor 310 includes a first side 314 and a bottom portion 316. The component 320 may include a top portion 322. The first side 314 of the inductor 310 extends beyond an end or side of the component 320. As a result, the inductor 310 has an empty space region between the bottom portion 316 and the PCB on which the component 320 is placed. While two sides of the inductor 310 are shown to extend beyond respective sides of the component 320, any number of sides of the inductor 310 may extend beyond respective sides of the component 320. For example, only one side of the inductor 310 may extend beyond only one side of the component 320 while another side of the inductor 310 may be adjacent to another respective side of the component 320. In some cases, all four sides of the inductor 310 (which may be a rectangle) may extend beyond a perimeter of the component 320.

The inductor 310 includes a first terminal 330A and a second terminal 330B. The first terminal 330A may extend vertically down from a middle or non-end or non-side portion of the inductor 310. Specifically, the first terminal 330A may extend from a first position that is a threshold or specified distance away from a side of the inductor 310 towards the center of the inductor 310. Similarly, the second terminal 330B may extend vertically down from an opposite middle or non-end or non-side portion of the inductor 310. Specifically, the second terminal 330B may extend from a second position that is a threshold or specified distance away from an opposite side of the inductor 310 towards the center of the inductor 310. The first and second terminals 330A and 330B may be equally or non-equally spaced or positioned relative to the center of the inductor 310. The first terminal 330A vertically extends through the component 320 to couple the inductor 310 to a first portion of circuitry implemented by the component 320. The second terminal 330B vertically extends through the component 320 to couple the inductor 310 to a second portion of circuitry implemented by the component 320.

Figure 4:
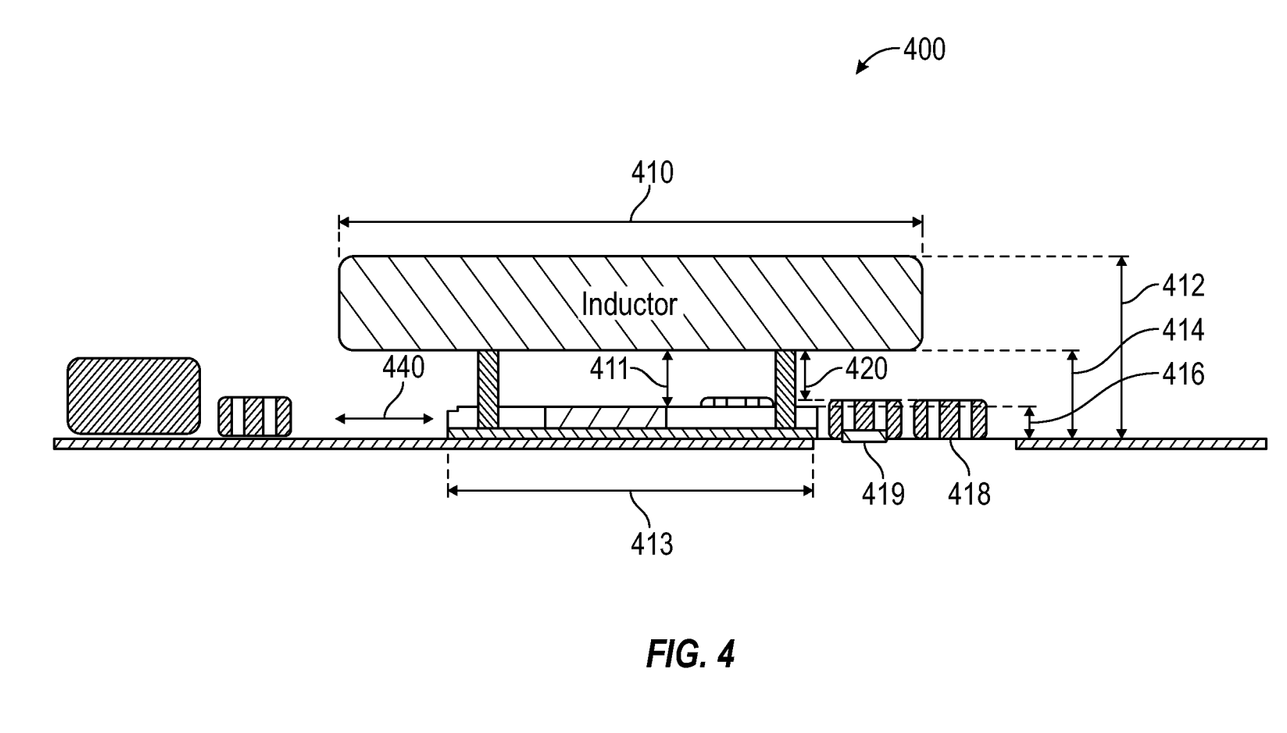
FIG. 4 is a block diagram of an example of a side view of the CoP package regulator device physical layout in accordance with various embodiments.

FIG. 4 is a block diagram of an example of a side view 400 of the CoP package regulator device (e.g., the component-on-top package regulator device 100 (FIG. 1) in accordance with various embodiments. As shown in side view 400, the inductor (e.g., inductor 310) has a length 410 (e.g., 4 millimeters to 8 millimeters). The component 320 (underneath the inductor 310) may have a width 413 of 3 millimeters to 9 millimeters. As an example, the length 410 of the inductor 310 may be 8 millimeters while the width of the component 320 is 3 millimeters. In this example, the inductor 310 may extend beyond the component 320 by an amount 440 (e.g., 2.5 millimeters) on each of its sides.

A height of the leads or terminals 330A and 330B of the inductor 310 may be selected or adjusted to control the overhang clearance 411 from the bottom of the inductor 310 to the top of the component 320 (e.g., how much empty space is between a bottom of the inductor 310 and a top of the component 320). By creating longer leads or terminals 330A and 330B a greater amount of empty space can be provided between the inductor 310 and the component 320 allowing the component 320 to dissipate a greater amount of heat. In this way, rather than increasing the mold thickness of the component 320 as a way to dissipate heat, the mold thickness 416 can remain small and heat can be dissipated through the inductor 310 in high airflow or in liquid immersion applications. Namely, the increased space between the inductor and the molded package allows greater heat dissipation in such applications. Alternatively, shorter leads or terminals 330A and 330B of the inductor 310 can be used to bring the inductor 310 closer to the component 320 to act as a heat sink for component 320.

In one example, the height 414 represents the overhang clearance from the bottom of the inductor 310 to the top of the PCB on which the component 320 is placed and may be 1.5 millimeters to 2.7 millimeters. The height 412 represents 412 represents the total height of the CoP package regulator device and may be 4 millimeters to 10 millimeters.

In some implementations, one or more active and/or passive components 419 and 418 may be coupled to the CoP package regulator device and be external to the CoP package regulator device. These components 419 and 418 may be coupled to the PCB on the same layer as the component 320. Component 419 may be completely covered or overlaid by the inductor 310 (e.g., the region within the amount 440 that the inductor 310 extends beyond sides of the component 320) while component 418 is partially covered or overlaid by the inductor 310. The height 420 is the overhand clearance from under the inductor 310 and the top of the components 419 and 418.

Figure 5:
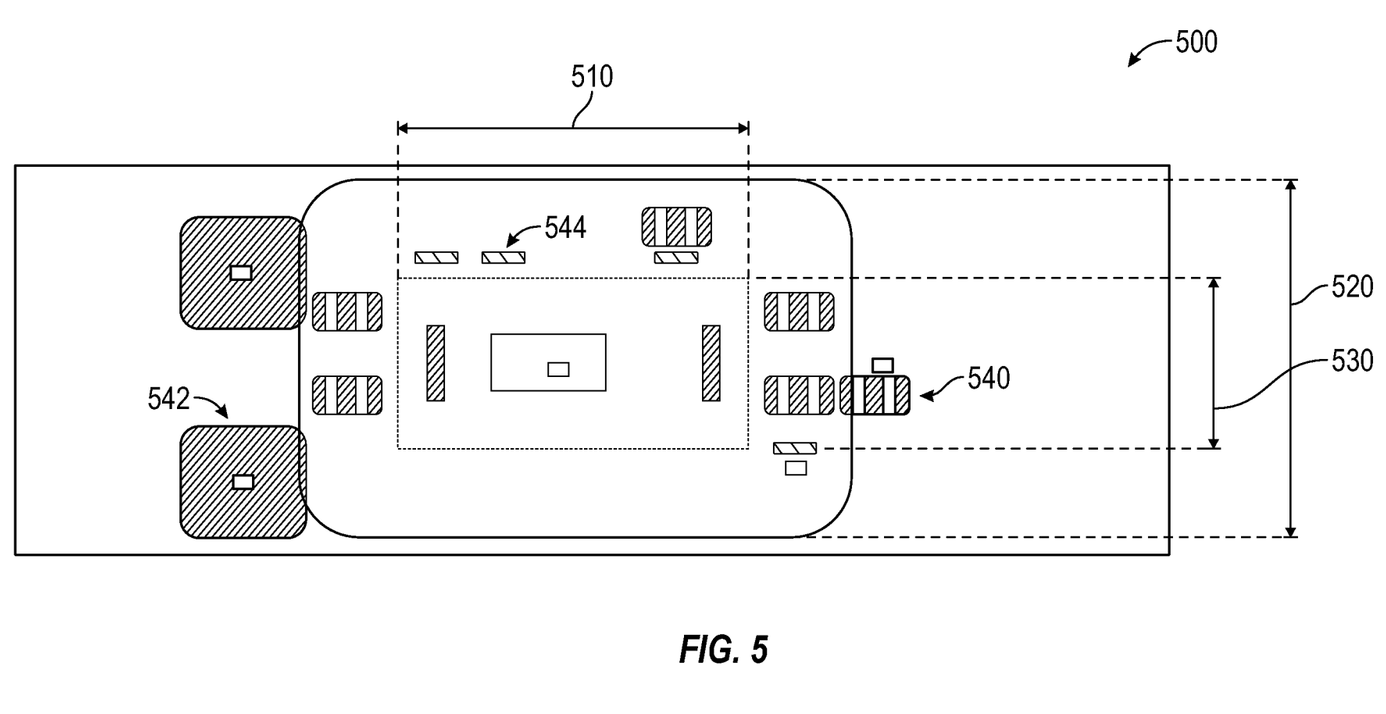
FIG. 5 is a block diagram of an example of a top view of the CoP package regulator device physical layout in accordance with various embodiments.

FIG. 5 is a block diagram of an example of a top view 500 of the CoP package regulator device (e.g., the component-on-top package regulator device 100 (FIG. 1) in accordance with various embodiments. As shown in top view 500, the inductor 310 has a width 520 (e.g., 4 millimeters to 8 millimeters) that extends beyond a length 530 of the component 320 (e.g., 2 millimeters to 6.25 millimeters). The inductor 310 has four sides that extend beyond the periphery of the component 320. A first component 544 (e.g., an active or passive capacitor or resistor) can be placed in a region that is completely covered or underneath one of the sides of the inductor 310 that extend beyond a side of the component 320. A second component 540 (e.g., an active or passive capacitor or resistor) can be placed in a region that is partially covered or underneath a second one of the sides of the inductor 310 that extend beyond a second side of the component 320. A third component 542 (e.g., an active or passive capacitor or resistor) can be placed in a region that is outside of the region of the inductor 310 that extend beyond a side of the component 320. Each of the first, second and third components 540, 542, and 544 may be an external component to the CoP package regulator device that is coupled to the CoP package regulator device through the PCB on which the CoP package regulator device is placed.

Figure 6:
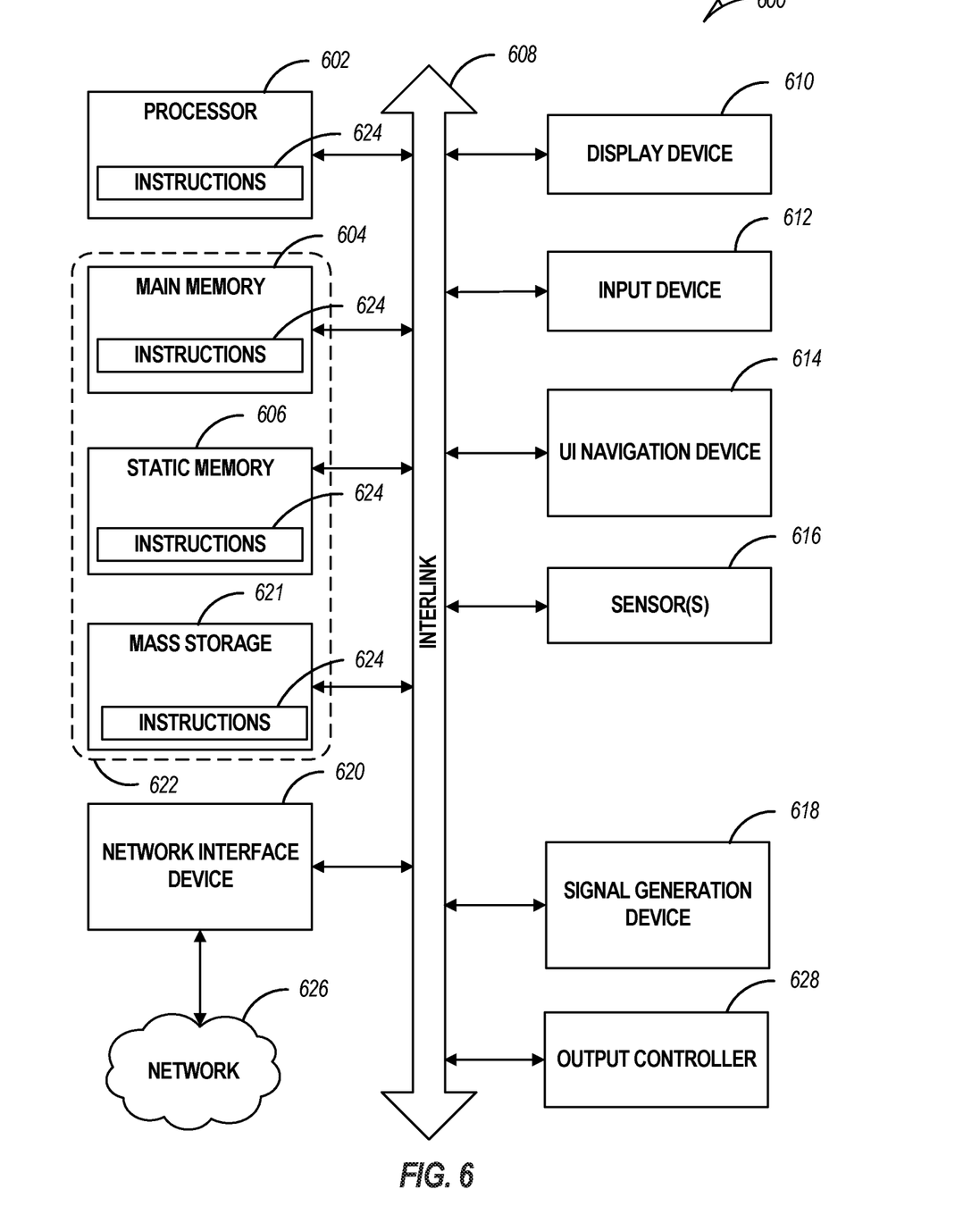
FIG. 6 is a block diagram illustrating an example of a machine upon which one or more embodiments may be implemented.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. The machine 600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a graphics processing unit (GPU), a hardware processor core, or any combination thereof), a main memory 604, and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612, and UI navigation device 614 may be a touch screen display. The machine 600 may additionally include a storage device (e.g., drive unit); a signal generation device 618 (e.g., a speaker); a network interface device 620; one or more sensors 616, such as a global positioning system (GPS) sensor, wing sensors, mechanical device sensors, temperature sensors, ICP sensors, bridge sensors, audio sensors, industrial sensors, compasses, accelerometers, or other sensors. The machine 600 may include an output controller 628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device may include a machine-readable medium 622 on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 621 may constitute the machine-readable medium 622.

While the machine-readable medium 622 is illustrated as a single medium, the term "machine-readable medium" may include a single medium or multiple media (e.g., a centralized or distributed database, or associated caches and servers) configured to store the one or more instructions 624.

The term "machine-readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, and can be accessed by the main memory 604 for use by the hardware processor 602. The main memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the main memory 604 for use by the hardware processor 602. When the main memory 604 is full, virtual space from the storage device 621 can be allocated to supplement the main memory 604; however, because the storage device 621 is typically slower than the main memory 604, and write speeds are typically at least twice as slow as read speeds, use of virtual memory can greatly reduce user experience due to storage device latency (in contrast to the main memory 604; e.g., DRAM). Further, use of the storage device 621 for virtual memory can greatly reduce the usable lifespan of the storage device 621.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards networks, and peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 600, and includes digital or analog communications signals or other tangible or intangible media to facilitate communication of such software.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim is still deemed to fall within the scope of that claim. Moreover, in the following claims, the terms "first," "second," "third," etc. are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly language code, a higher-level language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random-access memories (RAMs), read-only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A component-on-top (CoP) package comprising:
a system-in-package (SIP) comprising regulator circuitry, the SIP having a top portion and a first side portion; and
an inductor on the top portion of the SIP, the inductor comprising first and second terminals each within a specified distance inside a perimeter formed by ends of the inductor, the first and second terminals extending from a bottom surface of the inductor, the first and second terminals being physically directly connected to the top portion of the SIP to form an empty space region between the bottom surface of the inductor and the top portion of the SIP, the empty space region having a width corresponding to a distance between the first and second terminals and having a height corresponding to a length of the first and second terminals, the SIP being a first discrete component and the inductor being a second discrete component, wherein:
the inductor is coupled to the regulator circuitry via the top portion of the SIP; and
the perimeter formed by the ends of the inductor extends beyond a perimeter of the SIP.

2. The CoP package of claim 1, wherein the inductor and the regulator circuitry of the SIP together implement a switching regulator, the first and second terminals extending vertically from the bottom surface of the inductor.

3. The CoP package of claim 1, wherein the regulator circuitry includes a switching circuit for charging and discharging the inductor, the SIP comprising a ball grid array package.

4. The CoP package of claim 1, wherein a first portion of the SIP is fabricated using a first fabrication process, and wherein a second portion of the SIP is fabricated using a second fabrication process that differs from the first fabrication process.

5. The CoP package of claim 1, wherein components on the SIP are bonded together through a series of integrated-passive devices that are fabricated using thin-film or photolithography processing.

6. The CoP package of claim 1, wherein heat is dissipated through the inductor in a liquid immersion application via the empty space region.

7. The CoP package of claim 1, wherein an amount of heat dissipation is controlled based on a size of the empty space region determined by the length of the first and second terminals.

8. The CoP package of claim 1, the first and second terminals being non-equally spaced relative to a center of the inductor.

9. The CoP package of claim 1, the first terminal being at a first distance away from a center of the inductor and the second terminal being at a second distance away from the center, the first distance being greater than the second distance.

10. The CoP package of claim 9, wherein the first terminal is at a first position on the bottom portion of the inductor, the first position being at a specified distance from a first end of the inductor, and the first position overlaps the top portion of the SIP.

11. The CoP package of claim 1, wherein the SIP is coupled to a circuit board.

12. The CoP package of claim 11, wherein a passive or active component on the circuit board comprises another SIP, a resistor, a capacitor, integrated-passive device, a transistor or an inductor.

13. The CoP package of claim 1, wherein at least a portion of a plurality of passive or active components are physically placed around a periphery of the SIP within a region between ends of the inductor and sides of the periphery of the SIP.

14. A method comprising:
generating a regulated voltage signal by a regulator circuitry implemented on a system-in-package (SIP), the SIP having a top portion and a first side portion, the SIP coupled to an inductor via the top portion of the SIP, the inductor comprising first and second terminals each within a specified distance inside a perimeter formed by ends of the inductor, the first and second terminals extending from a bottom surface of the inductor, the first and second terminals being physically directly connected to the top portion of the SIP to form an empty space region between the bottom surface of the inductor and the top portion of the SIP, the empty space region having a width corresponding to a distance between the first and second terminals and having a height corresponding to a length of the first and second terminals, the SIP being a first discrete component and the inductor being a second discrete component and the perimeter formed by the ends of the inductor extends beyond a perimeter of the SIP; and
delivering the regulated voltage to a load.

15. The method of claim 14, wherein an amount of heat dissipation is controlled based on a size of the empty space region determined by the length of the first and second terminals.

16. The method of claim 14, wherein the inductor and the regulator circuitry of the SIP together implement a switching regulator.

17. The method of claim 14, wherein the regulator circuitry includes a switching circuit for charging and discharging the inductor.

18. The method of claim 14, wherein a second end of the inductor extends beyond a second side portion of the SIP.

19. An apparatus comprising:
means for generating a regulated voltage signal by a regulator circuitry implemented on a system-in-package (SIP), the SIP having a top portion and a first side portion, the SIP coupled to an inductor via the top portion of the SIP, the inductor comprising first and second terminals each within a specified distance inside a perimeter formed by ends of the inductor, the first and second terminals extending from a bottom surface of the inductor, the first and second terminals being physically directly connected to the top portion of the SIP to form an empty space region between the bottom surface of the inductor and the top portion of the SIP, the empty space region having a width corresponding to a distance between the first and second terminals and having a height corresponding to a length of the first and second terminals, the SIP being a first discrete component and the inductor being a second discrete component and a first end the perimeter formed by the ends of the inductor extends beyond a perimeter of the SIP; and
means for delivering the regulated voltage to a load.

20. The apparatus of claim 19, wherein the inductor and the regulator circuitry of the SIP together implement a switching regulator.

21. The apparatus of claim 19, wherein the regulator circuitry includes a switching circuit for charging and discharging the inductor.

22. The apparatus of claim 19, wherein a second end of the inductor extends beyond a second side portion of the SIP.

* * * * *

UNITED STATES PATENT AND TRADEMARK OFFICE
CERTIFICATE OF CORRECTION

PATENT NO. : 11,270,986 B2
APPLICATION NO. : 16/998666
DATED : March 8, 2022
INVENTOR(S) : Odabaee et al.

It is certified that error appears in the above-identified patent and that said Letters Patent is hereby corrected as shown below:

In the Claims

In Column 14, Line 44, in Claim 19, after "and", delete "a first end"

Signed and Sealed this
Sixth Day of February, 2024

Katherine Kelly Vidal
*Director of the United States Patent and Trademark Office*